United States Patent
Choi

(10) Patent No.: US 9,349,823 B2
(45) Date of Patent: May 24, 2016

(54) METHODS OF SCALING THICKNESS OF A GATE DIELECTRIC STRUCTURE, METHODS OF FORMING AN INTEGRATED CIRCUIT, AND INTEGRATED CIRCUITS

(71) Applicant: GLOBALFOUNDRIES, Inc., Grand Cayman (KY)

(72) Inventor: Kisik Choi, Hopewell Junction, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 58 days.

(21) Appl. No.: 14/080,533

(22) Filed: Nov. 14, 2013

(65) Prior Publication Data

US 2015/0129972 A1    May 14, 2015

(51) Int. Cl.
| | |
|---|---|
| H01L 21/02 | (2006.01) |
| H01L 29/51 | (2006.01) |
| H01L 27/092 | (2006.01) |
| H01L 21/8234 | (2006.01) |
| H01L 21/8238 | (2006.01) |

(52) U.S. Cl.
CPC ...... *H01L 29/512* (2013.01); *H01L 21/823462* (2013.01); *H01L 21/823857* (2013.01); *H01L 27/092* (2013.01)

(58) Field of Classification Search
CPC .............. H01L 27/092; H01L 21/8238; H01L 21/28088; H01L 21/28176; H01L 29/517; H01L 29/66545; H01L 29/513
USPC ........... 438/212; 257/369, E27.062, E21.632
See application file for complete search history.

(56) References Cited

U.S. PATENT DOCUMENTS

| | | | | |
|---|---|---|---|---|
| 5,763,922 | A * | 6/1998 | Chau | 257/371 |
| 6,228,721 | B1 * | 5/2001 | Yu | 438/275 |
| 7,227,201 | B2 * | 6/2007 | Varghese et al. | 257/204 |
| 8,198,685 | B2 * | 6/2012 | Liu | H01L 21/28194 257/369 |
| 2007/0287199 | A1 * | 12/2007 | Hsu et al. | 438/3 |
| 2008/0070367 | A1 * | 3/2008 | Pae | H01L 21/28167 438/287 |
| 2008/0242012 | A1 * | 10/2008 | Pae | H01L 21/28079 438/197 |

(Continued)

OTHER PUBLICATIONS

McDonnell, S. et al., "Interfacial oxide re-growth in thin film metal oxide III-V semiconductor systems," Applied Physics Letters 100, 141606, pp. 1-4, (2012).

*Primary Examiner* — Jae Lee
*Assistant Examiner* — Mohammed R Alam
(74) *Attorney, Agent, or Firm* — Ingrassia Fisher & Lorenz, P.C.

(57) ABSTRACT

Methods of scaling thickness of a gate dielectric structure that overlies a semiconductor substrate, methods of forming an integrated circuit, and integrated circuits are provided. A method of scaling thickness of a gate dielectric structure that overlies a semiconductor substrate includes providing the semiconductor substrate. An interfacial oxide layer is formed in or on the semiconductor substrate. A high-k dielectric layer is formed over the interfacial oxide layer. An oxygen reservoir is formed over at least a portion of the high-k dielectric layer. A sealant layer is formed over the oxygen reservoir. The semiconductor substrate including the oxygen reservoir disposed thereon is annealed to diffuse oxygen through the high-k dielectric layer and the interfacial oxide layer from the oxygen reservoir. Annealing extends the interfacial oxide layer into the semiconductor substrate at portions of the semiconductor substrate that underlie the oxygen reservoir to form a regrown interfacial region in or on the semiconductor substrate.

19 Claims, 4 Drawing Sheets

(56) References Cited

U.S. PATENT DOCUMENTS

| | | | |
|---|---|---|---|
| 2010/0155854 A1* | 6/2010 | Stahrenberg | H01L 21/82345 257/392 |
| 2010/0176454 A1* | 7/2010 | Hooker | 257/369 |
| 2010/0187610 A1* | 7/2010 | Kwon et al. | 257/369 |
| 2010/0320547 A1* | 12/2010 | Ando et al. | 257/411 |
| 2011/0260255 A1* | 10/2011 | Wang | H01L 21/28176 257/368 |
| 2013/0032886 A1* | 2/2013 | Ando et al. | 257/369 |

* cited by examiner

METHODS OF SCALING THICKNESS OF A GATE DIELECTRIC STRUCTURE, METHODS OF FORMING AN INTEGRATED CIRCUIT, AND INTEGRATED CIRCUITS

TECHNICAL FIELD

The technical field generally relates to methods of scaling a thickness of a gate dielectric structure that overlies a semiconductor substrate, methods of forming integrated circuits, and integrated circuits. More particularly, the technical field relates to methods of scaling a thickness of an interfacial oxide layer that enables selective regrowth of the interfacial oxide layer.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel and that is separated from the channel by a gate dielectric structure. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

As advanced metal-oxide-semiconductor (MOS) technology continues to scale and move into the deep-sub-micron geometry dimensions, scaling of the gate dielectric structure has been widely explored to minimize inversion thickness ($T_{inv}$), i.e., thickness of an inversion layer or inversion channel within the gate dielectric structure, while maintaining operability of the MOSFETs. One technique that has been employed to scale $T_{inv}$ while maintaining operability of the MOSFETs is to include one or more high-k dielectric layer in the gate dielectric structure in combination with an interfacial oxide layer such as silicon oxide. The high-k dielectric layer enables $T_{inv}$ to be scale down to about 14 Å without sacrificing reliability of the FETs. As used herein, high dielectric constant or "high k" means having a dielectric constant greater than about 3.9. However, further scaling of $T_{inv}$ often results in poor reliability of the resulting FETs, with leakage current through the gate dielectric structure increasing exponentially with the decrease in the $T_{inv}$. Nitridation of the interfacial oxide layer has also been employed in combination with use of the high-k dielectric layer to provide $T_{inv}$ scaling without sacrificing reliability of N-type FETs. For example, $T_{inv}$ of the gate dielectric structure can be effectively scaled by another 2 Å through nitridation of the interfacial oxide layer. However, nitridation of the interfacial oxide layer negatively impacts reliability of P-type FETs, where negative bias temperature instability (NBTI) is a function of nitrogen in the gate dielectric structure. Regrowth of the interfacial oxide layer through annealing in an oxygenated environment may reverse the impact of nitridation on reliability of the P-type FETs. However, interfacial oxide layer regrowth also occurs at locations of the N-type FETs, thereby negating the benefits of nitridation on $T_{inv}$ scaling for the N-type FETs. Further, annealing in the oxygenated environment may also adversely impact dielectric properties of the high-k dielectric layer.

Accordingly, it is desirable to provide methods of scaling thickness of a gate dielectric structure that enables selective regrowth of the interfacial oxide layer at particular locations of the interfacial oxide layer while also minimizing impact on dielectric properties of the high-k dielectric layer. Furthermore, other desirable features and characteristics of the present invention will become apparent from the subsequent detailed description of the invention and the appended claims, taken in conjunction with the accompanying drawings and this background of the invention.

BRIEF SUMMARY

Methods of scaling thickness of a gate dielectric structure that overlies a semiconductor substrate, methods of forming an integrated circuit, and integrated circuits are provided herein. In an embodiment, a method of scaling thickness of a gate dielectric structure that overlies a semiconductor substrate includes providing the semiconductor substrate. An interfacial oxide layer is formed in or on the semiconductor substrate. A high-k dielectric layer is formed over the interfacial oxide layer. An oxygen reservoir is formed over at least a portion of the high-k dielectric layer. A sealant layer is formed over the oxygen reservoir. The semiconductor substrate including the oxygen reservoir disposed thereon is annealed to diffuse oxygen through the high-k dielectric layer and the interfacial oxide layer from the oxygen reservoir. Annealing extends the interfacial oxide layer into the semiconductor substrate at portions of the semiconductor substrate that underlie the oxygen reservoir to form a regrown interfacial region in or on the semiconductor substrate.

In another embodiment, a method of forming an integrated circuit includes providing a semiconductor substrate that includes an N-type field effect transistor well and a P-type field effect transistor well. An interfacial oxide layer is formed within the N-type field effect transistor well and the P-type field effect transistor well. The interfacial oxide layer is nitrided, and a high-k dielectric layer is formed over the interfacial oxide layer after nitriding the interfacial oxide layer. An oxygen reservoir is formed over at least the P-type field effect transistor well. The semiconductor substrate including the oxygen reservoir disposed on the semiconductor substrate is annealed to diffuse oxygen through the high-k dielectric layer and the interfacial oxide layer from the oxygen reservoir. Annealing extends the interfacial oxide layer into the P-type field effect transistor well to form an regrown interfacial region. A gate electrode structure is formed over the N-type field effect transistor well and the P-type field effect transistor well including over the regrown interfacial region.

In another embodiment, an integrated circuit includes a semiconductor substrate that includes an N-type field effect transistor well and a P-type field effect transistor well. An interfacial oxide layer is disposed over the N-type field effect transistor well and the P-type field effect transistor well. A high-k dielectric layer is disposed over the interfacial oxide layer. A regrown interfacial region is formed in the P-type field effect transistor well adjacent to the interfacial oxide layer. The N-type field effect transistor well is free from the regrown interfacial region. A gate electrode structure is disposed over the N-type field effect transistor well and the P-type field effect transistor well including over the regrown interfacial region.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
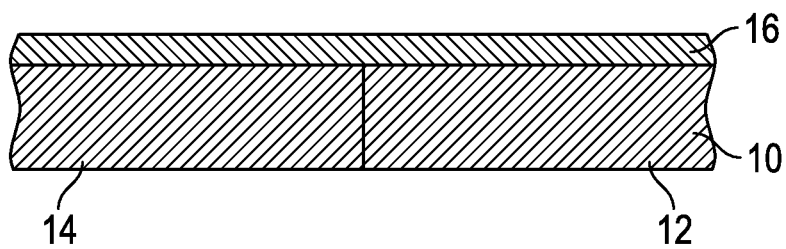
FIGS. 1-5 are cross-sectional side views illustrating a method of forming an integrated circuit in accordance with an exemplary embodiment, with FIG. 5 illustrating an exemplary integrated circuit formed in accordance with the exemplary method.

The following detailed description is merely exemplary in nature and is not intended to limit the various embodiments or the application and uses thereof. Furthermore, there is no intention to be bound by any theory presented in the preceding background or the following detailed description.

Provided herein is a method of scaling thickness of a gate dielectric structure that overlies a semiconductor substrate, as well as integrated circuits and methods of forming integrated circuits with a scaled gate dielectric structure that overlies the semiconductor substrate. Scaling, as described herein, refers to modification of a thickness of a gate dielectric structure. The gate dielectric structure, as described herein, refers to all layers of dielectric material that are disposed over and/or within the semiconductor substrate and over which a gate electrode structure is to be formed in accordance with conventional MOS fabrication, with the gate dielectric structure being disposed between the semiconductor substrate and the gate electrode structure. In accordance with the methods described herein, an interfacial oxide layer is formed in or on the semiconductor substrate and a high-k dielectric layer is formed over the interfacial oxide layer. An oxygen reservoir is formed over at least a portion of the high-k dielectric layer where regrowth of interfacial oxide is desired, with a sealant layer formed over the oxygen reservoir. The oxygen reservoir, as referred to herein, is a structure that provides a source of oxygen under annealing conditions. The sealant layer is a structure that effectively inhibits oxygen diffusion thereinto. The interfacial oxide layer is extended into the semiconductor substrate at portions of the semiconductor substrate that underlie the oxygen reservoir by annealing the semiconductor substrate to form a regrown interfacial region in or on the semiconductor substrate, with the regrown interfacial region including an oxide of the semiconductor material in the semiconductor substrate. In particular, the oxygen reservoir provides oxygen that diffuses through the high-k dielectric layer and the interfacial oxide layer to form the regrown interfacial region in areas of the semiconductor substrate that underlie the oxygen reservoir, with the sealant layer inhibiting excessive ambient oxygen from diffusing into the high-k dielectric layer during annealing. As a result, the regrown interfacial region includes an oxide material that is similar in composition to the interfacial oxide layer. In this manner, selective formation of the regrown interfacial region may be achieved in desired areas of the semiconductor substrate while minimizing impact on dielectric properties of the high-k dielectric layer and while also maintaining benefits associated with $T_{inv}$ scaling through nitridation in other areas of the semiconductor substrate. As such, the regrown interfacial region alleviates reliability concerns that may arise due to excessive $T_{inv}$ scaling of the interfacial oxide layer and may be selectively formed only in areas of the semiconductor substrate that could give rise to reliability concerns.

Referring to FIG. 1, in accordance with an exemplary embodiment of a method for forming an integrated circuit, a semiconductor substrate 10 is provided. The semiconductor substrate 10 includes semiconductor material. As used herein, the phrase "semiconductor material" includes monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIG. 1, the semiconductor substrate 10 is a bulk silicon material. It is to be appreciated that, although not shown, additional layers may be present below the semiconductor substrate 10 in accordance with conventional integrated circuit configurations.

In an embodiment and as shown in FIG. 1, the semiconductor substrate 10 includes a P-type field effect transistor (FET) well 12 and an N-type FET well 14, in anticipation of forming P-type FETs (PFETs) and N-type FETs (PFETs) in accordance with conventional integrated circuit fabrication. In particular, the semiconductor substrate 10 is configured for later formation of a complimentary MOS integrated circuit (CMOS IC), which includes both NMOS FETs and PMOS FETs. To form the P-type FET well 12 and the N-type FET well 14, the semiconductor substrate 10 may be doped with an appropriate dopant, i.e., a conventional p-type or n-type dopant. The methods described herein are particularly suitable when both the P-type FET well 12 and the N-type FET well 14 are present in the semiconductor substrate 10 because $T_{inv}$ scaling considerations are different for gate dielectric structures over the P-type FET well 12 and the N-type FET well 14, with the methods provided for selective techniques for $T_{inv}$ scaling to enable separate $T_{inv}$ scaling for regions of the semiconductor substrate 10 with the P-type FET well 12 and the N-type FET well 14.

Figure 2:
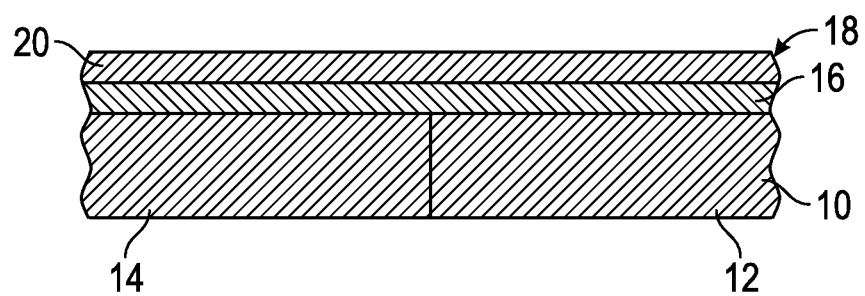

Referring again to FIG. 1, in an embodiment an interfacial oxide layer 16 is formed in or on the semiconductor substrate 10, such as within the N-type FET well 14 and the P-type FET well 12 of the semiconductor substrate 10. The interfacial oxide layer 16, as referred to herein, is an oxide of the semiconductor material of the semiconductor substrate 10 and is one layer in a gate dielectric structure 18 that is shown in FIG. 2. The interfacial oxide layer 16 may be formed through a dedicated technique that is intended to only form the interfacial oxide layer 16, or may be passively formed as a result of other processing techniques such as during pre-cleaning or during subsequent formation and thermal treatment of a high-k dielectric layer over the semiconductor substrate 10, as described in further detail below. Although conventional techniques for forming the interfacial oxide layer 16 may be employed, an example of dedicated technique that is suitable for forming the interfacial oxide layer 16 is wet chemical oxidation through treatment with a mixture of ammonium hydroxide, hydrogen peroxide and water at an ambient temperature of about 21° C. The interfacial oxide layer 16 helps minimize mobility degradation in the semiconductor substrate 10 that may otherwise occur due to high-k dielectric material in a subsequently-formed high-k dielectric layer in the gate dielectric structure, as described in further detail below. However, the interfacial oxide layer 16 is generally thicker than necessary and may be thinned to decrease $T_{inv}$ of the gate dielectric structure that includes the interfacial oxide layer 16 and the high-k dielectric layer. Typically, the thickness of the interfacial oxide layer 16 is from about 13 Å to about 40 Å, although lesser and greater thicknesses are also contemplated herein. In accordance with the methods described herein, even thinner initial thickness of the interfacial oxide layer 16, below 10 Å, is possible, with later oxide regrowth selectively employed to thicken the interfacial oxide layer 16 where desired. Thinning of the interfacial oxide layer 16 may be conducted through conventional techniques such as wet cleans that leave hydrogen terminated molecules on a surface of the interfacial oxide layer.

In an embodiment, the interfacial oxide layer 16 is nitrided. Nitriding the interfacial oxide layer 16 results in introduction of nitrogen into the interfacial oxide layer 16 to produce oxynitride such as, for example, silicon oxynitride. Because silicon oxynitride has a higher k-value than silicon oxide, further scaling of the interfacial oxide layer 16 after nitridation by an additional 2 Å (such as down to 11 Å) is possible while maintaining reliability of the NFET that is ultimately formed over the N-type FET well 14. However, reliability of the PFET that is ultimately formed over the P-type FET well 12 is compromised by nitriding and scaling the $T_{inv}$ of the interfacial oxide layer 16. In particular, negative bias temperature instability in the PFET is associated with nitridation of the interfacial oxide layer 16, leading to shift in voltage threshold over time. The methods described herein address and alleviate PFET reliability concerns that are associated with nitridation of the interfacial oxide layer 16, as described in further detail below. Nitridation may be conducted through conventional techniques such as through rapid thermal annealing (RTA) in an ammonia ambient, or through direct plasma nitridation (DPN).

After optional nitridation and as shown in FIG. 2, a high-k dielectric layer 20 is formed over the interfacial oxide layer 16. In an embodiment, the high-k dielectric layer 20 is formed directly on the interfacial oxide layer 16. The high-k dielectric layer 20 may be formed through conventional techniques, and may include any material that has a dielectric constant greater than about 3.9. Examples of suitable high-k dielectric materials include, but are not limited to, hafnium oxide, titanium oxide, zirconium oxide, lanthanum oxide, strontium oxide, iridium oxide, aluminum oxide, and the like. $T_{inv}$ is generally minimized such that the thickness of the high-k dielectric layer 20 is also minimized while maintaining performance. The high-k dielectric layer 20 may have a thickness of from about 5 Å to about 30 Å.

Figure 3:
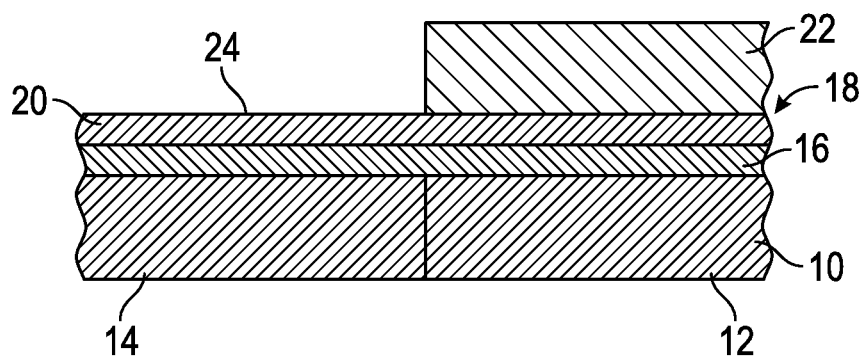

In an embodiment and as shown in FIG. 3, an oxygen reservoir 22 is formed over at least a portion of the high-k dielectric layer 20 for purposes of providing a source of oxygen that enables later regrowing of the interfacial oxide within the semiconductor substrate 10 as described in further detail below. In embodiments and as shown in FIG. 3, the oxygen reservoir 22 is disposed directly upon the high-k dielectric layer 20. However, in other embodiments and referring momentarily to FIG. 6, one or more additional layers 32, 34 may be disposed between the oxygen reservoir 22 and the high-k dielectric layer 20 as described in further detail below. The oxygen reservoir 22 may be formed over at least the P-type FET well 12, with later regrowth of the interfacial oxide alleviating any reliability concerns associated with the optional nitridation of the interfacial oxide layer 16. For example, in an embodiment and as shown in FIG. 3, the oxygen reservoir 22 is formed over only a portion of the high-k dielectric layer 20, such as over the P-type FET well 12, with an exposed portion 24 of the high-k dielectric layer 20 free from the oxygen reservoir 22. The oxygen reservoir 22 may be formed over only the portion of the high-k dielectric layer 20 by conventional patterning a blanket-formed layer of material for the oxygen reservoir 22 in a desired configuration of the oxygen reservoir 22. In this embodiment, oxide regrowth within the semiconductor substrate 10 at the exposed portion 24 can be minimized or avoided while enabling oxide regrowth in areas of the semiconductor substrate 10 that underlie the oxygen reservoir 22.

Suitable materials for the oxygen reservoir 22 include any material that provides a source of oxygen under annealing conditions. Additionally, in various embodiments the oxygen reservoir 22 is removed prior to gate electrode formation and, thus, includes material that may be selectively removed from the high-k dielectric layer 20. However, it is to be appreciated that in embodiments, the oxygen reservoir 22 may remain disposed over the semiconductor substrate 10 in the final integrated circuit. Various metal nitrides and metal carbides may be suitable materials for the oxygen reservoir 22, and the oxygen reservoir 22 may include at least about 99 weight % or those materials, with oxygen present in the oxygen reservoir 22 as a result of conventional formation techniques. In particular, CVD, PVD, ALD techniques may be employed to form the oxygen reservoir 22 from materials such as, but not limited to, titanium nitride, tantalum nitride, tungsten nitride, titanium carbide, tantalum carbide, and/or tungsten carbide. The aforementioned materials experience natural oxidation after deposition or tend to attract oxygen as an impurity during deposition. Further, the aforementioned materials have a propensity to lose oxygen during subsequent annealing and certain materials more readily release oxygen than other of the materials. For instance, tantalum nitride loses oxygen more readily than titanium nitride. In a specific embodiment, the oxygen reservoir 22 includes titanium nitride. In another specific embodiment, the oxygen reservoir 22 includes tantalum nitride. Thickness of the oxygen reservoir 22 may also affect proper function of the oxygen reservoir 22 as a source of sufficient amounts of oxygen to enable oxide regrowth within the semiconductor substrate 10, and the thickness may depend upon particular thicknesses of the high-k dielectric layer 20 and the interfacial oxide layer 16. In a specific embodiment, where thickness of the interfacial oxide layer 16 is minimized to about 11 Å after nitridation and where the high-k dielectric layer 20 has a minimized thickness of about 5 Å, an appropriate thickness of the oxygen reservoir 22 that includes titanium nitride is at least about 2 nm, such as about 10 nm. Because tantalum nitride provides oxygen at a higher rate than titanium nitride, an appropriate thickness of the oxygen reservoir 22 that includes tantalum nitride is at least about 0.5 nm, such as about 2 nm.

Figure 4:
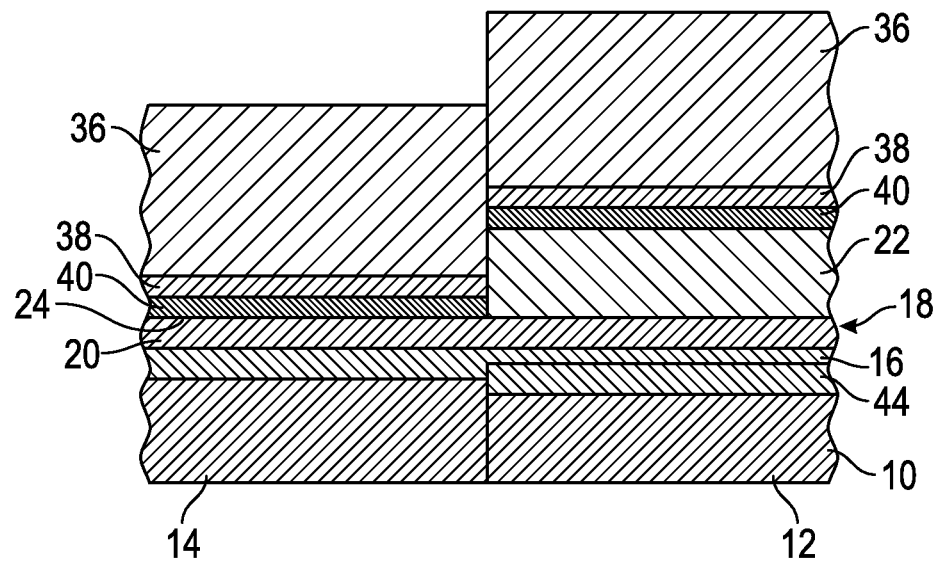

Referring to FIG. 4, a sealant layer 36 is formed over the oxygen reservoir 22 for inhibiting excessive ambient oxygen from diffusing into the high-k dielectric layer 20 during annealing. The sealant layer 36 enables controllable interfacial oxide regrowth under appropriate annealing conditions while minimizing an unpredictable impact from environmental oxygen during annealing. Examples of suitable materials for the sealant layer 36 include, but are not limited to, semiconductor or dielectric materials. Examples of suitable semiconductor materials include, but are not limited to amorphous or crystalline silicon. Examples of suitable dielectric materials include, but are not limited to, silicon nitride and silicon oxide. In various embodiments, the sealant layer 36 is formed from a material that may be selectively removed from a layer that is disposed directly beneath the sealant layer 36. Thickness of the sealant layer 36 may also impact performance of the sealant layer 36. For example, the sealant layer 36 may have a thickness of from about 3 to about 20 nm to enable the sealant layer 36 to effectively inhibit diffusion of environmental oxygen therethrough an into the oxygen reservoir 22 during annealing.

In various embodiments and although not shown in the Figures, the sealant layer 36 may be disposed directly upon the oxygen reservoir 22 and on the exposed portion 24 of the high-k metal layer. However, one or more intervening layers 38, 40 may be disposed between the sealant layer 36 and the oxygen reservoir 22 and/or between the sealant layer 36 and the exposed portion 24 of the high-k dielectric layer 20. The one or more intervening layers 38, 40 may be incorporated for various purposes. For example, depending upon the material chosen for the sealant layer 36, the material of the sealant layer 36 may diffuse into, react with, or otherwise affect the dielectric properties of the high-k dielectric layer 20. In an embodiment and as shown in FIG. 4, to avoid interaction between the sealant layer 36 and the exposed portion 24 of the high-k dielectric layer 20, one of the intervening layers 38, 40 is a delamination structure 38 that is formed over the oxygen reservoir 22 and over the exposed portion 24 of the high-k dielectric layer 20 prior to forming the sealant layer 36 over the oxygen reservoir 22. The delamination structure 38 provides a physical barrier between the sealant layer 36 and the exposed portion 24 of the high-k dielectric layer 20 and may include any material that may be selectively etched from at least the high-k dielectric layer 20 and that does not materially degrade the dielectric properties of the high-k dielectric layer 20. In an embodiment, the delamination structure 38 includes a nitride such as titanium nitride. Notably, titanium nitride may be employed to form both the delamination structure 38 and the oxygen reservoir 22, which the distinction being thickness of the respective structures. In this embodiment, the delamination structure 38 is sufficiently thin to inhibit oxide regrowth in the semiconductor substrate 10 beneath the exposed portion 24 of the high-k dielectric layer 20 while having sufficient thickness to inhibit interaction between the sealant layer 36 and the high-k dielectric layer 20. For example, the delamination structure 38 may have a thickness of from about 0.5 to less than about 2 nm, especially when titanium nitride is used.

Figure 5:
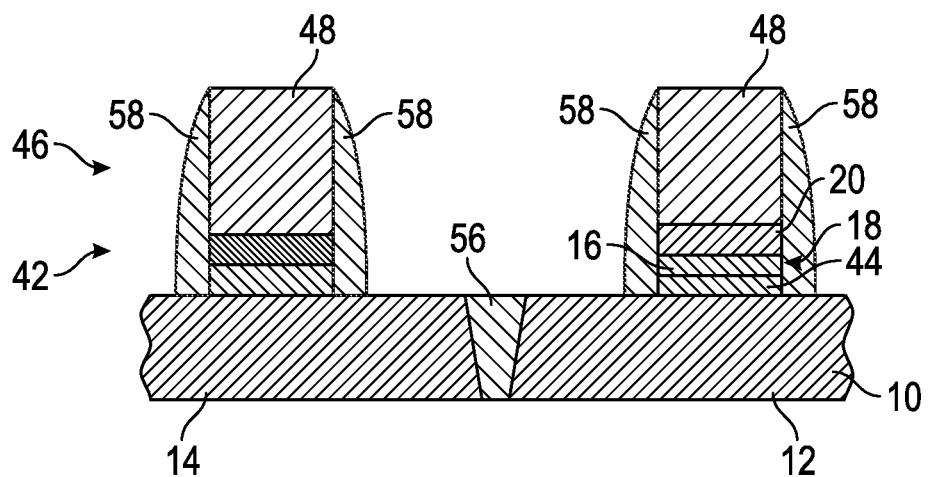

Another type of intervening layer that may be incorporated between the sealant layer 36 and the oxygen reservoir 22 and/or between the sealant layer 36 and the exposed portion 24 of the high-k dielectric layer 20 is a leakage inhibiting layer 40, which may be formed independent of the delamination structure 38. The leakage inhibiting layer 40 may be formed prior to forming the delamination structure 38, with the delamination structure 38 formed over the leakage inhibiting layer 40 when both are present. At thin $T_{inv}$ leakage current through the high-k dielectric layer 20 and the interfacial oxide layer 16 may impact device performance especially at the N-type FET well 14. By forming the leakage inhibiting layer 40 over the oxygen reservoir 22 and over the exposed portion 24 of the high-k dielectric layer 20, selective formation of the leakage inhibiting layer 40 may be achieved with the leakage inhibiting layer 40 separated from the portion of the high-k dielectric layer 20 that underlies the oxygen reservoir 22. During annealing, the material from the leakage inhibiting layer 40 may be driven into the high-k dielectric layer 20 in the exposed portion 24 of the high-k dielectric layer 20, resulting in a modified high-k dielectric layer 42 as shown in FIG. 5. Suitable materials for the leakage inhibiting layer 40 include, but are not limited to, lanthanides such as lanthanum oxide.

After the sealant layer 36 is in place, the semiconductor substrate 10 including the oxygen reservoir 22 and the sealant layer 36, among other structures described above, is annealed to diffuse oxygen through the high-k dielectric layer 20 and the interfacial oxide layer 16 from the oxygen reservoir 22. Annealing, as referred to herein, is any type of treatment at high environmental temperatures (greater than ambient temperature) around the semiconductor substrate 10. Annealing is effective to extend the interfacial oxide layer 16 into the semiconductor substrate 10 at portions of the interfacial oxide layer 16 that underlie the oxygen reservoir 22 to thereby form a regrown interfacial region 44 in the semiconductor substrate 10. For example and as shown in FIG. 4, the interfacial oxide layer 16 may be extended into the P-type FET well 12 adjacent to the interfacial oxide layer 16 to form the regrown interfacial region 44, thereby alleviating the impact of nitridation on PFET reliability. In the embodiment shown in FIG. 4, because the oxygen reservoir 22 is not disposed over the N-type FET well 14, the N-type FET well 14 is free from the regrown interfacial region. The regrown interfacial region 44, as referred to herein, is any extension of oxide material into the semiconductor substrate 10 that forms beneath the oxygen reservoir 22 and that is not present prior to annealing.

Suitable annealing conditions may be readily determined based upon materials of the oxygen reservoir 22 and thickness of various layers over the semiconductor substrate 10. In embodiments, annealing is conducted through conventional techniques such as, but not limited to, a spiked annealing process, rapid thermal annealing, laser annealing, or in a conventional furnace. Annealing may be conducted with a peak environmental temperature, i.e., temperature of a gaseous environment surrounding the semiconductor substrate 10 and overlying structures, of at least 700° C. For example, in a specific embodiment for the structure as shown in FIG. 4, the spiked annealing process can be conducted by gradually increasing environmental temperature to a peak temperature in a range of from about 950° C. to about 1000° C. and maintained at the peak temperature for about 5 seconds. However, exact conditions may be dependent upon the desired thickness of the regrown interfacial region 44.

After annealing, various layers may be removed from over the semiconductor substrate 10. For example, in an embodiment, the sealant layer, the delamination structure, and the oxygen reservoir may be removed after annealing through conventional techniques such as etching. The resulting structure may then be further prepared for FEOL processing, including gate electrode formation, to produce an integrated circuit 46 including a gate electrode structure 48 as shown in FIG. 5. In particular, in the embodiment shown in FIG. 5, gate electrode structures 48 are formed over the N-type FET well 14 and the P-type FET well 12 including over the regrown interfacial region 44, with a shallow trench isolation (STI) structure 56 and sidewall spacers 58 formed in accordance with conventional FEOL processing. Although not shown, source and drain regions as well as other features may be formed in accordance with conventional FEOL processing to complete formation of PFETs and NFETs over the semiconductor substrate 10. In other embodiments and although not shown, the delamination layer and the oxygen reservoir may optionally remain disposed over the semiconductor substrate and can be incorporated into the final integrated circuit. However, the sealant layer is generally removed after annealing in all embodiments.

Figure 6:
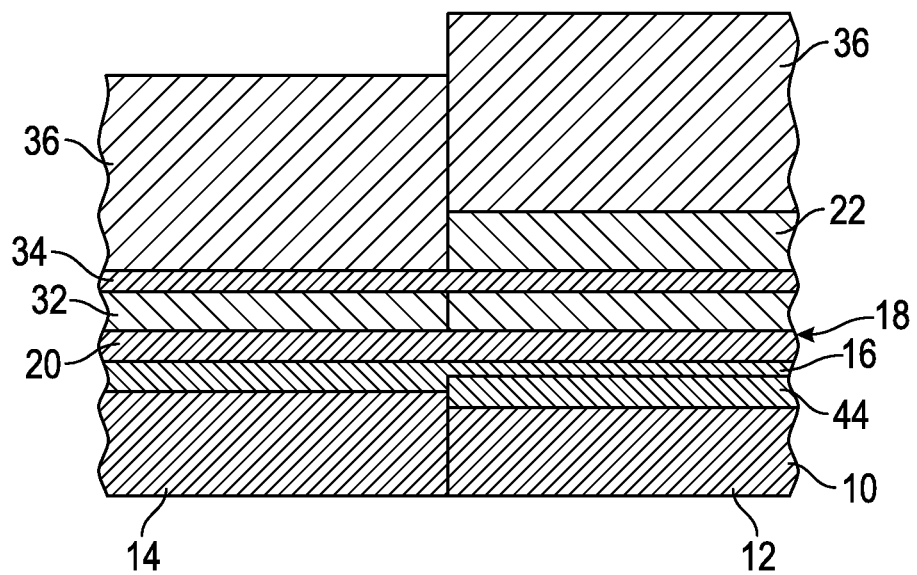
FIG. 6 is a cross-sectional side view illustrating an alternative configuration of structures to the configuration shown in FIG. 4 in accordance with another exemplary embodiment of a method of forming an integrated circuit.

Another embodiment of a method of forming an integrated circuit will now be described with reference to FIG. 6. The semiconductor substrate 10 is provided and the interfacial oxide layer 16 and high-k dielectric layer 20 are formed over the semiconductor substrate 10 in the same manner as described above. However, in this embodiment and as alluded to above, one or more additional layers 32, 34 are disposed between the oxygen reservoir 22 and the high-k dielectric layer 20 and are formed prior to forming the oxygen reservoir 22. In particular, in this embodiment, a combination of protecting layers including a first protecting layer 32 and a second protecting layer 34 are formed over the high-k dielectric layer 20 prior to forming the oxygen reservoir 22 for purposes of protecting the high-k dielectric layer 20 during removal of the oxygen reservoir 22 and to minimize interaction between the sealant layer 36 and the high-k dielectric layer 20. In this embodiment, the first protecting layer 32 may include tantalum nitride and the second protecting layer 34 may include titanium nitride, which enables the oxygen reservoir 22 to be effectively removed under circumstances where the protecting layers 32, 34 are to remain over the semiconductor substrate 10 during formation of the gate electrode structures and where the oxygen reservoir 22 contains the same material as the second protecting layer 34. However, it is to be appreciated that in other embodiments and although not shown, a single protecting layer may be effective to protect the high-k dielectric layer 20. Annealing and FEOL processing may proceed in the same manner as described above.

Figure 7:
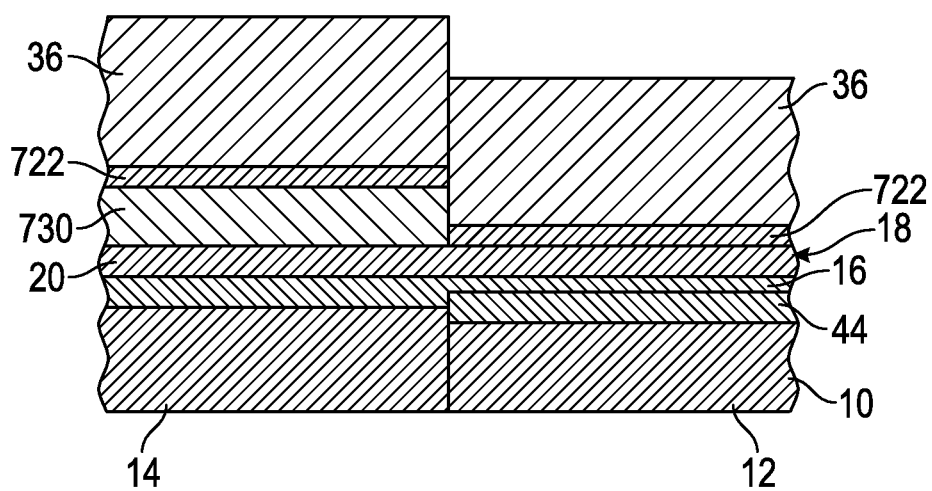
FIGS. 7 and 8 are cross-sectional side views illustrating an alternative configuration of structures to the configuration shown in FIG. 4 in accordance with another exemplary embodiment of a method of forming an integrated circuit.
Figure 8:
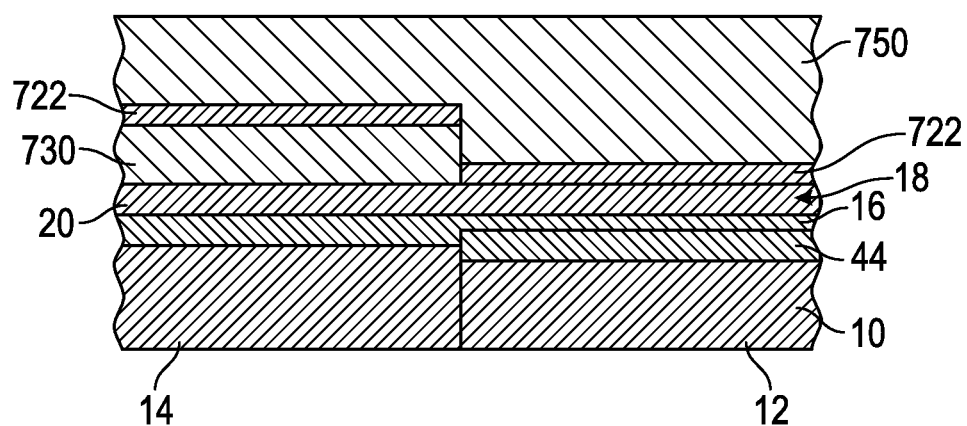

Another embodiment of a method of forming an integrated circuit will now be described with reference to FIGS. 7 and 8. The semiconductor substrate 10 is provided and the interfacial oxide layer 16 and high-k dielectric layer 20 are formed over the semiconductor substrate 10 in the same manner as described above. However, in this embodiment, an oxygen reservoir 722 is continuously formed over the P-type FET well 12 and over N-type FET well 14. Also, in this embodiment, the oxygen reservoir 722 is schematically shown having a lesser thickness than the oxygen reservoir 22 of FIGS. 1-6, and such lesser thickness may be appropriate when tantalum nitride is used in the oxygen reservoir 722. To avoid oxide regrowth in the N-type FET well 14, an oxygen scavenging structure 730 may be formed over the N-type FET well 14 prior to continuously forming the oxygen reservoir 722 over the P-type FET well 12 and over N-type FET well 14. The oxygen scavenging structure 730 may include any material that readily reacts with oxygen to thereby inhibit diffusion of oxygen from the oxygen reservoir 722 through the layers that overlie the N-type FET well 14. In embodiments, the oxygen scavenging structure 730 may include materials chosen from titanium nitride, aluminum-containing materials, and other metals that readily react with oxygen. Thickness of the oxygen scavenging structure 730 is not limited, provided that the oxygen scavenging structure 730 effectively inhibits oxide regrowth in the semiconductor substrate 10 at the N-type FET well 14. Under circumstances where titanium nitride is used in the oxygen scavenging structure 730, the oxygen scavenging structure 730 may have a thickness of less than 2 nm to avoid the titanium nitride from functioning as an oxygen reservoir itself. Annealing may proceed in the same manner as described above. However, in an embodiment, the oxygen reservoir 722 and the oxygen scavenging structure 730 may remain over the high-k dielectric layer 20 during formation of the gate electrode structure and may be incorporated into the integrated circuit. In an embodiment and as shown in FIG. 8, a gap fill structure 750, such as a tungsten layer formed through chemical vapor deposition, may be formed over the oxygen reservoir 722 and the oxygen scavenging structure 730, followed by electrode formation over the gap fill structure 750. FEOL processing may then proceed as described above.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, the method comprising:
    providing a semiconductor substrate including an N-type field effect transistor well and a P-type field effect transistor well;
    forming an interfacial oxide layer within the N-type field effect transistor well and the P-type field effect transistor well;
    nitriding the interfacial oxide layer;
    forming a high-k dielectric layer over the interfacial oxide layer after nitriding the interfacial oxide layer;
    forming an oxygen reservoir over at least the P-type field effect transistor well;
    annealing the semiconductor substrate including the oxygen reservoir disposed thereon to diffuse oxygen through the high-k dielectric layer and the interfacial oxide layer from the oxygen reservoir, thereby extending the interfacial oxide layer into the P-type field effect transistor well to form an regrown interfacial region; and
    forming a gate electrode structure over the N-type field effect transistor well and the P-type field effect transistor well including over the regrown interfacial region.

2. The method of claim 1, further comprising removing the oxygen reservoir prior to forming the gate electrode structure.

3. The method of claim 2, wherein forming the oxygen reservoir comprises forming the oxygen reservoir comprising titanium nitride having a thickness of at least 2 nm only over the P-type field effect transistor well.

4. The method of claim 1, wherein forming the gate electrode structure comprises forming the gate electrode structure over the oxygen reservoir.

5. The method of claim 4, wherein forming the oxygen reservoir comprises forming the oxygen reservoir comprising tantalum nitride having a thickness of at least 0.5 nm with the oxygen reservoir disposed directly upon the high-k dielectric layer.

6. The method of claim 1, wherein forming the oxygen reservoir comprises forming the oxygen reservoir only over the P-type field effect transistor well.

7. The method of claim 6, wherein forming the oxygen reservoir comprises forming the oxygen reservoir comprising titanium nitride having a thickness of at least 2 nm.

8. The method of claim 1, wherein the method further comprises forming an oxygen scavenging structure over the N-type field effect transistor well prior to forming the oxygen reservoir.

9. The method of claim 8, wherein forming the oxygen reservoir comprises forming the oxygen reservoir continuously over the P-type field effect transistor well and over the oxygen scavenging structure over the N-type field effect transistor well.

10. The method of claim 8, wherein the oxygen reservoir is disposed directly upon the high-k dielectric layer.

11. The method of claim 10, wherein forming the oxygen reservoir further comprises forming the oxygen reservoir comprising tantalum nitride having a thickness of at least 0.5 nm.

12. The method of claim 11, wherein forming the oxygen reservoir comprises forming the oxygen reservoir over only a portion of the high-k dielectric layer over the P-type field effect transistor well with an exposed portion of the high-k dielectric layer free from the oxygen reservoir.

13. The method of claim 12, further comprising forming a sealant layer over the oxygen reservoir.

14. The method of claim 13, further comprising forming a delamination structure over the oxygen reservoir and the exposed portion of the high-k dielectric layer prior to forming the sealant layer over the oxygen reservoir.

15. The method of claim 14, further comprising forming a leakage inhibiting layer over the exposed portion of the high-k dielectric layer prior to forming the delamination structure thereover.

16. The method of claim 14, wherein forming the sealant layer further comprises forming the sealant layer over the delamination structure disposed over the oxygen reservoir and over the exposed portion of the high-k dielectric layer.

17. The method of claim 14, further comprising removing the sealant layer and the delamination structure after annealing.

18. The method of claim 12, further comprising forming a delamination structure over the high-k dielectric layer prior to forming the oxygen reservoir.

19. An integrated circuit comprising:
- a semiconductor substrate including an N-type field effect transistor well and a P-type field effect transistor well;
- an interfacial oxide layer disposed over the N-type field effect transistor well and the P-type field effect transistor well;
- a high-k dielectric layer disposed over the interfacial oxide layer;
- a regrown interfacial region formed in the P-type field effect transistor well adjacent to the interfacial oxide layer, wherein the N-type field effect transistor well is free from the regrown interfacial region; and
- a gate electrode structure disposed over the N-type field effect transistor well and the P-type field effect transistor well including over the regrown interfacial region.

* * * * *